(12) United States Patent
Nakabayashi

(10) Patent No.: US 6,747,320 B2
(45) Date of Patent: Jun. 8, 2004

(54) SEMICONDUCTOR DEVICE WITH DRAM INSIDE

(75) Inventor: Takashi Nakabayashi, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/623,342

(22) Filed: Jul. 18, 2003

(65) Prior Publication Data

US 2004/0026759 A1 Feb. 12, 2004

(30) Foreign Application Priority Data

Aug. 7, 2002 (JP) ..................................... 2002-230478

(51) Int. Cl.$^7$ ................................................ G11C 7/00
(52) U.S. Cl. ..................... 257/369; 257/401; 365/205; 365/174
(58) Field of Search ................... 257/365–377, 257/390–401; 365/205–208, 174

(56) References Cited

U.S. PATENT DOCUMENTS 5,389,810 A 2/1995 Agata et al.
2002/0097609 A1 * 7/2002 Shiga et al. ........... 365/189.02

FOREIGN PATENT DOCUMENTS

JP 2713082 10/1997

* cited by examiner

*Primary Examiner*—H. Jey Tsai
(74) *Attorney, Agent, or Firm*—Merchant & Gould P.C.

(57) ABSTRACT

A semiconductor device is provided in which the difference in characteristics between a pair of sense amplifier transistors of a DRAM is suppressed, whereby the sensitivity of a sense amplifier is enhanced. A pair of gate electrodes of a N-type sense amplifier transistor and a pair of gate electrodes of a P-type sense amplifier transistor constituting a CMOS sense amplifier of the DRAM respectively are placed in parallel to each other in one active region in the same direction as that of bit lines. A pair of adjacent N-type sense amplifier transistors and a pair of adjacent P-type sense amplifier transistors are isolated by STI.

9 Claims, 5 Drawing Sheets

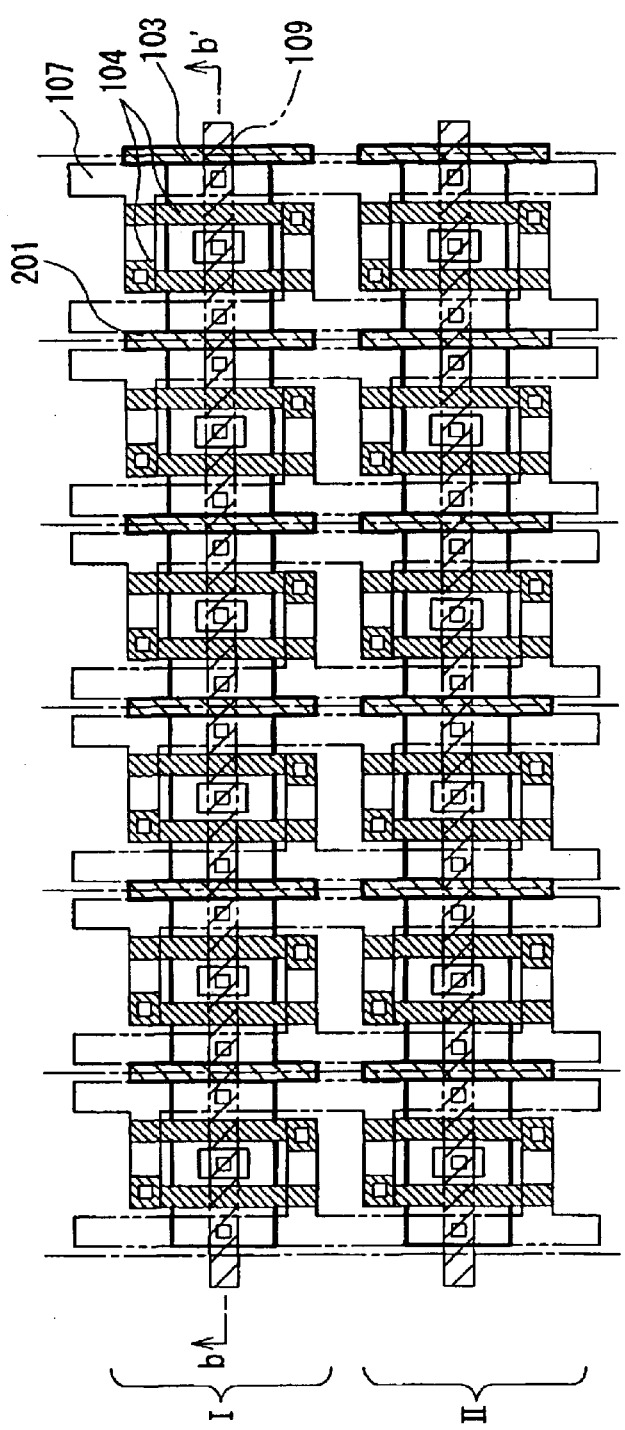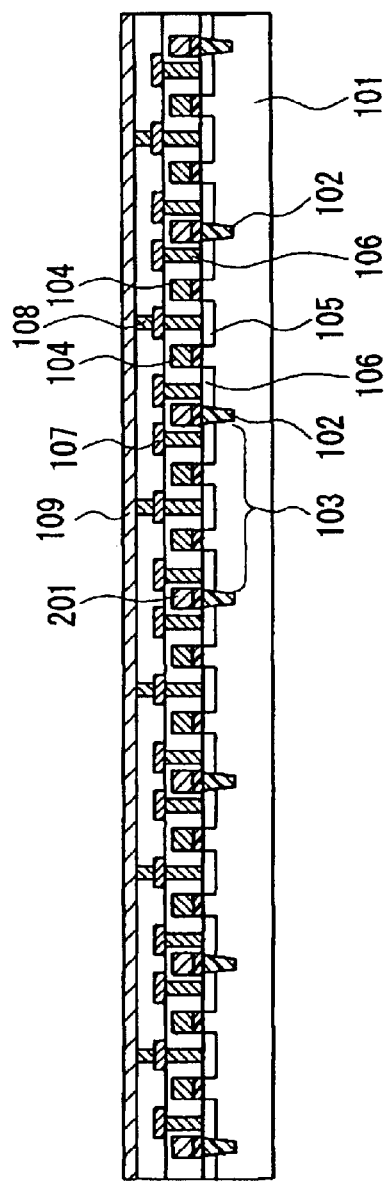
FIG. 2A
FIG. 2B

SEMICONDUCTOR DEVICE WITH DRAM INSIDE

BACKGROUND OF THE INVENTION

1. Field of the Invention

The present invention relates to a semiconductor device, and in particular, to an EDRAM, in which a DRAM is co-resident with a high-speed CMOS logic circuit.

2. Description of the Related Art

In LSI production, commodity DRAMs placing importance on mass-productivity and cost and logic LSIs placing importance on a high speed and a high function are considered as two pillars, and they have been produced respectively. Due to the advancement of a miniaturization technique and the like, an EDRAM having the faculties of both the DRAM and the logic LSI are put into practical use. In the EDRAM, a band width connecting a DRAM to a logic circuit can be widened, which enables high-speed data processing to be performed. Thus, the EDRAM is considered as a key device in an information society that requires high-speed processing of a large amount of data.

In order for a commodity DRAM to be co-resident with a high-speed logic, a number of novel techniques and improvement of a fabrication process, such as shortened heat treatment time for forming a capacitive film, are required. It also is necessary to improve the layout of a sense amplifier of a DRAM. This problem will be described below with reference to the drawings.

FIG. 5 is a plan view showing a mask layout of a conventional CMOS sense amplifier transistor of a DRAM.

In FIG. 5, a region I is a N-type sense amplifier transistor pair region formed on a P-type semiconductor substrate, and a region II is a P-type sense amplifier transistor pair region formed on a N-type semiconductor substrate. The sense amplifier transistor has a ring-type gate electrode 504. Drain regions of a pair of upper and lower transistors in the ring-type gate electrodes 504 are connected in a diagonally crossed manner to bit lines 507 made of upper layer metal wiring to form a differential circuit. Furthermore, reference numeral 509 denotes a power source line connected to a source region between a pair of ring-type gate electrodes 504.

In the above-mentioned sense amplifier, three sides of the ring-type gate electrode are used as channels. Therefore, a large gate width can be realized in a small area, and a transistor with high ability can be used. Furthermore, a drain region is limited to a small region surrounded by the ring-type gate electrode 504, so that diffusion capacitance is small and a high-speed operation is made possible.

However, in a layout of a conventional sense amplifier, a parasitic capacitor (gate overlap capacitor) is formed in a portion where one side of the ring-type gate electrode 504 that does not function as a transistor is overlapped with an active region 503, which degrades a high-speed property. In particular, in an advanced miniaturization process (e.g., 0.18 $\mu$m rule), a gate oxide film is made thin to about 35 nm, and the gate overlap capacitance thereof is very large, which is a serious problem.

Furthermore, due to a mask alignment shift during formation of an active region and during formation of a gate electrode, the gate overlap capacitance of a pair of upper and lower transistors is changed. Therefore, the ability balance between a pair of transistors is degraded, resulting in a decrease in sensitivity of the sense amplifier.

Furthermore, the ring-type gate electrode has a small depth of focus (DOF) at a corner portion thereof during lithography and a gate length varies greatly. As a result, a difference in characteristics is caused between a pair of transistors. This problem becomes more serious due to the advancement of miniaturization.

Furthermore, in a region in the ring-type gate electrode, during the salicide process for reducing parasitic resistance, the deposited film thickness of metal with a high melting point is made small due to insufficient coverage. As a result, a junction leakage is increased by the defective formation of silicide, causing a problem in a sense operation. Furthermore, there is a problem such as an increase in a stand-by current of a circuit.

SUMMARY OF THE INVENTION

Therefore, with the foregoing in mind, it is an object of the present invention to provide a semiconductor device in which the difference in characteristics between a pair of sense amplifier transistors of a DRAM is suppressed, whereby the sensitivity of a sense amplifier is enhanced.

In order to achieve the above-mentioned object, a first semiconductor device of the present invention includes a DRAM region and a high-speed CMOS logic region that are co-resident with each other. A pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines, and a pair of adjacent N-type sense amplifier transistors and a pair of adjacent P-type sense amplifier transistors are isolated by shallow trench isolation (STI) regions.

According to the above configuration, by placing the gate electrodes of the sense amplifier transistors in a line-and-space shape, the difference in transistor characteristics is suppressed, whereby a sense amplifier with high performance can be formed.

Furthermore, in the first semiconductor device of the present invention, it is preferable that floating electrodes are disposed on the shallow trench isolation regions between the pair of adjacent N-type sense amplifier transistors and between the pair of adjacent P-type sense amplifier transistors so as to be parallel to the pair of gate electrodes of each of the sense amplifier transistors. In this case, it is preferable that the pair of gate electrodes and the floating electrodes are disposed at a substantially equal interval.

According to the above configuration, by placing the gate electrodes of the sense amplifier transistors and the floating electrodes in a line-and-space shape at a substantially equal interval, the difference in transistor characteristics is suppressed, whereby a sense amplifier with high performance can be formed.

In order to achieve the above-mentioned object, a second semiconductor device of the present invention includes a DRAM region and a high-speed CMOS logic region that are co-resident with each other, wherein a pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines, active regions are connected to each other in a pair of adjacent N-type sense amplifier transistors and a pair of adjacent P-type sense amplifier transistors, and on the active regions, field shield electrodes are disposed between the pair of adjacent N-type sense amplifier transistors and between the pair of adjacent P-type sense amplifier transistors so as to be parallel to the pair of gate electrodes of each of the sense amplifier transistors.

In the second semiconductor device of the present invention, it is preferable that the pair of gate electrodes and the field shield electrodes are disposed at a substantially equal interval.

According to the above configuration, by placing the gate electrodes of the sense amplifier transistors and the field shield electrodes in a line-and-space shape at a substantially equal interval, the difference in transistor characteristics is suppressed, and by using field shield isolation, the area of the transistor active region can be enlarged, and the influence of process stress is suppressed, whereby a sense amplifier with high performance can be formed.

In order to achieve the above-mentioned object, a third semiconductor device of the present invention includes a DRAM region and a high-speed CMOS logic region that are co-resident with each other. A pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines. Active regions are connected to each other in a pair of adjacent N-type sense amplifier transistors. On the active regions, a field shield electrode is disposed between the pair of adjacent N-type sense amplifier transistors so as to be parallel to the pair of gate electrodes of the N-type sense amplifier transistor, a pair of adjacent P-type sense amplifier transistors are isolated by shallow trench isolation (STI) regions, and a floating electrode is disposed on the shallow trench isolation region between the pair of P-type sense amplifier transistors so as to be parallel to the pair of gate electrodes of the P-type sense amplifier transistor.

In the third semiconductor device of the present invention, it is preferable that the pair of gate electrodes of the N-type sense amplifier transistor and the field shield electrodes, and the pair of gate electrodes of the P-type sense amplifier transistor and the floating electrodes are disposed at a substantially equal interval.

According to the above configuration, by placing the gate electrodes of the N-type sense amplifier transistors and the field shield electrodes in a line-and-space shape at a substantially equal interval, and by placing the gate electrodes of the P-type sense amplifier transistors and the floating electrodes in a line-and-space shape at a substantially equal interval, the difference in transistor characteristics is suppressed. By using field shield isolation in the N-type sense amplifier transistor region, and by using STI isolation in the P-type sense amplifier transistor region, an influence of process stress is suppressed. Thus, a sense amplifier having high performance and excellent in current cut characteristics, can be formed.

Furthermore, in the second or third semiconductor device of the present invention, it is preferable that a negative voltage used for a ground potential or a substrate potential of a DRAM cell is applied to the field shield electrodes on the N-type active regions.

These and other advantages of the present invention will become apparent to those skilled in the art upon reading and understanding the following detailed description with reference to the accompanying figures.

BRIEF DESCRIPTION OF THE DRAWINGS

FIG. 2A is a plan view showing a mask layout of a DRAM sense amplifier transistor in a semiconductor device according to Embodiment 2 of the present invention.

FIG. 2B is a cross-sectional view of a N-type sense amplifier transistor region I taken along a line b–b' in FIG. 2A

DESCRIPTION OF THE PREFERRED EMBODIMENTS

Hereinafter, the present invention will be described by way of illustrative embodiments with reference to the drawings.

Embodiment 1

Figure 1A:
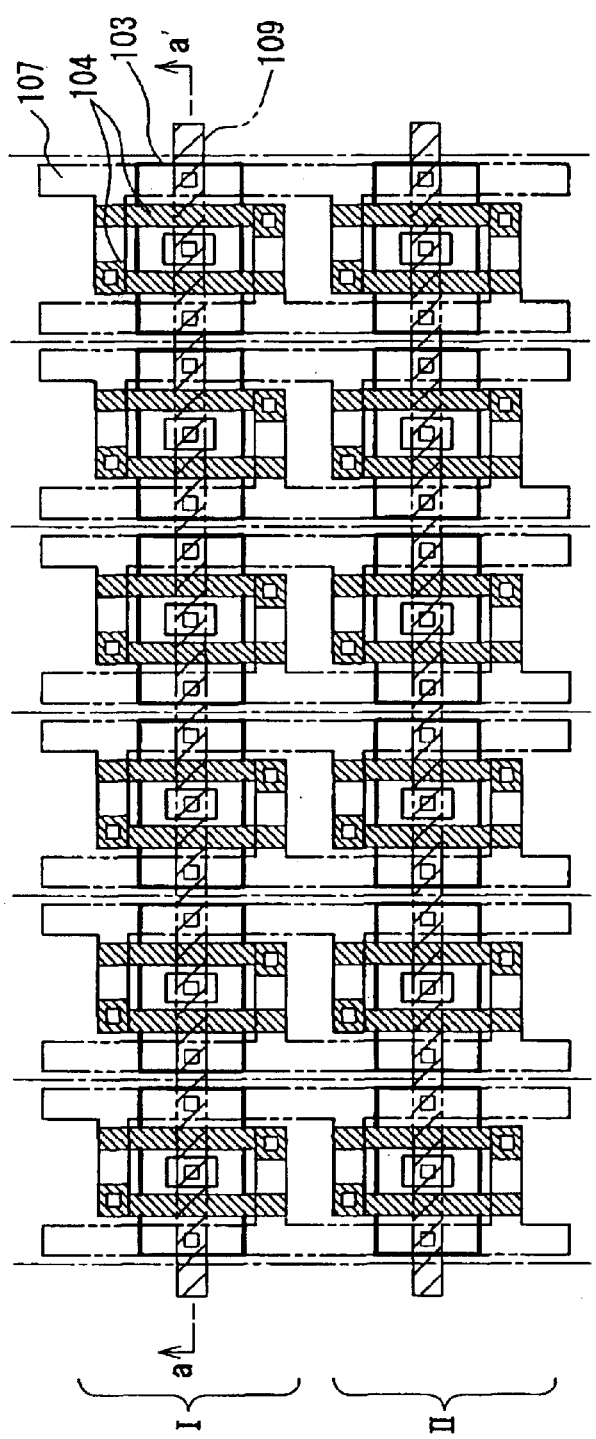
FIG. 1A is a plan view showing a mask layout of a DRAM sense amplifier transistor in a semiconductor device according to Embodiment 1 of the present invention.
Figure 1B:
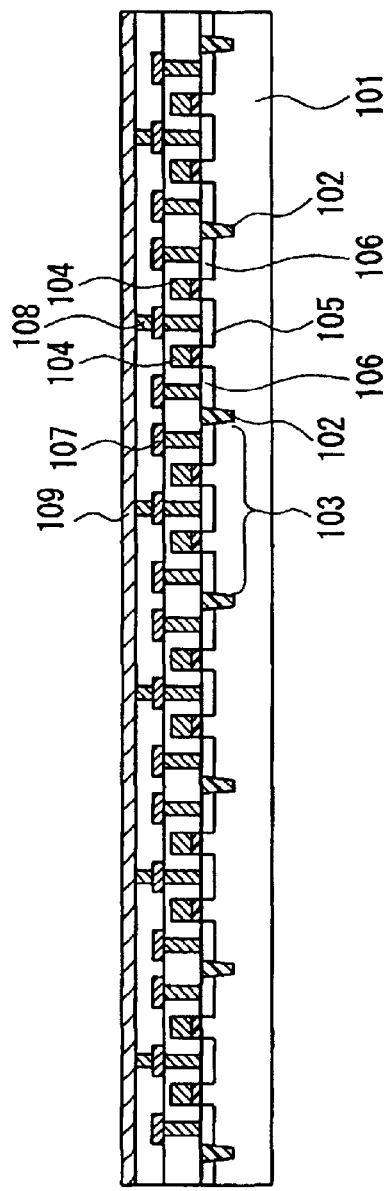
FIG. 1B is a cross-sectional view of a N-type sense amplifier transistor region I taken along a line a–a' in FIG. 1A.

FIG. 1A is a plan view showing a mask layout of a DRAM sense amplifier transistor in a semiconductor device according to Embodiment 1 of the present invention. FIG. 1B is a cross-sectional view of a N-type sense amplifier transistor region I taken along a line a–a' in FIG. 1A.

In FIG. 1B, a transistor active region 103 isolated by shallow trench isolation (STI) regions 102 is formed on a P-type semiconductor substrate 101, and a pair of linear gate electrodes 104 are formed in each transistor active region 103 via a gate insulating film in the same direction as that of bit lines 107. A source region 105 between the pair of linear gate electrodes 104 is connected to a power source line ($V_{ss}$) 109 made of upper layer metal wiring via a via plug 108. Drain regions 106 on both sides of the pair of linear gate electrodes 104 are connected to the bit lines 107 and the opposed gate electrodes 104 in a diagonally crossed manner to form a differential circuit.

As described above, according to the present embodiment, the gate electrodes 104 have a linear shape, and adjacent sense amplifier transistors are placed in a regular line-and-space shape. Therefore, a DOF can be made large during lithography. As a result, a variation in a gate processing size can be suppressed, whereby a sense amplifier transistor with high sensitivity can be realized.

Thus, by placing the gate electrodes of the sense amplifier transistors in a line-and-space shape, the difference in transistor characteristics can be suppressed, and a sense amplifier with high performance can be formed.

Embodiment 2

FIG. 2A is a plan view showing a mask layout of a DRAM sense amplifier transistor in a semiconductor device according to Embodiment 2 of the present invention. FIG. 2B is a cross-sectional view of a N-type sense amplifier transistor region I taken along a line b–b' in FIG. 2A. In FIGS. 2A and 2B, the same portions as those in FIGS. 1A and 1B are denoted with the same reference numerals as those therein, and the description thereof will be omitted here.

The present embodiment is different from Embodiment 1 in that floating electrodes 201 are formed on the STI regions 102 in parallel to the gate electrodes 104.

As described above, according to the present embodiment, the gate electrodes 104 have a linear shape, and adjacent sense amplifier transistors and the floating electrodes 201 are placed in a regular line-and-space shape at a substantially equal interval. Therefore, the DOF can be maximized during lithography. As a result, a variation in a gate processing size can be suppressed, whereby a sense amplifier transistor with high sensitivity can be realized.

Thus, by placing the gate electrodes of the sense amplifier transistors and the floating electrodes in a line-and-space shape at a substantially equal interval, the difference in transistor characteristics can be suppressed, and a sense amplifier with high performance can be formed.

Embodiment 3

Figure 3A:
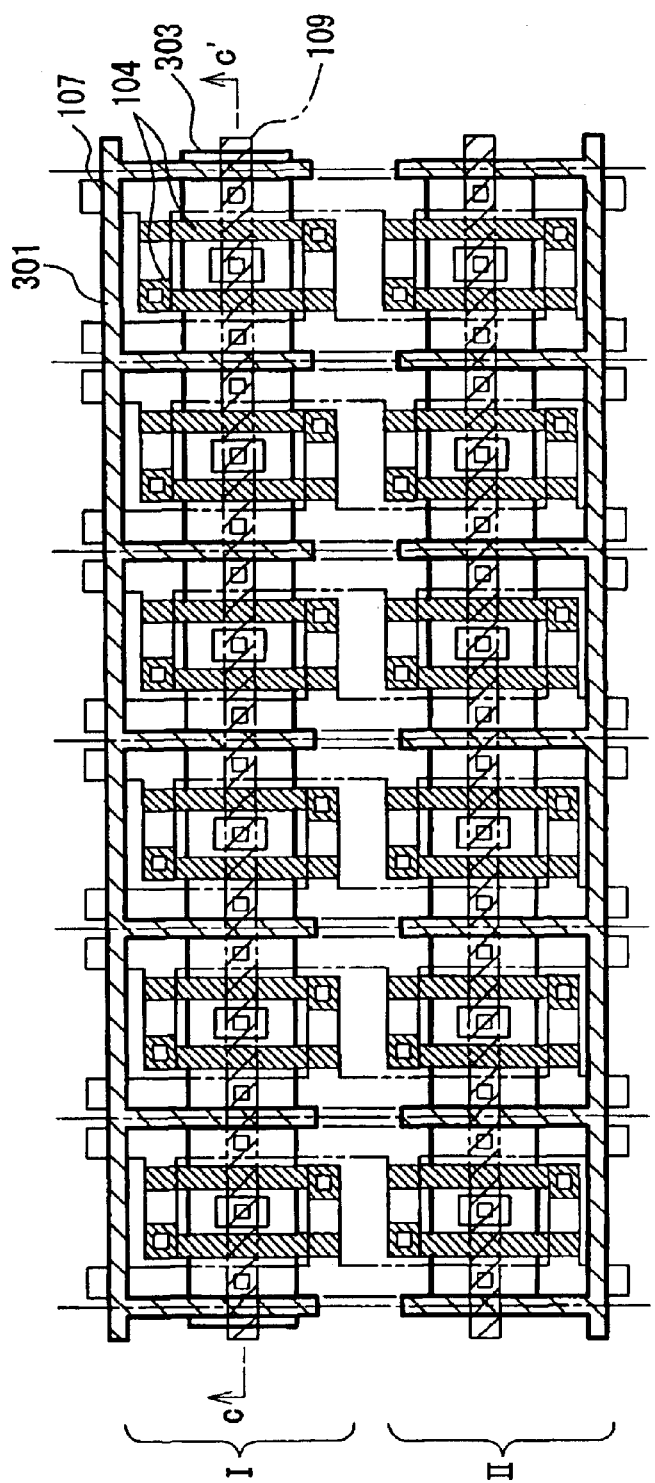
FIG. 3A is a plan view showing a mask layout of a DRAM sense amplifier transistor in a semiconductor device according to Embodiment 3 of the present invention.
Figure 3B:
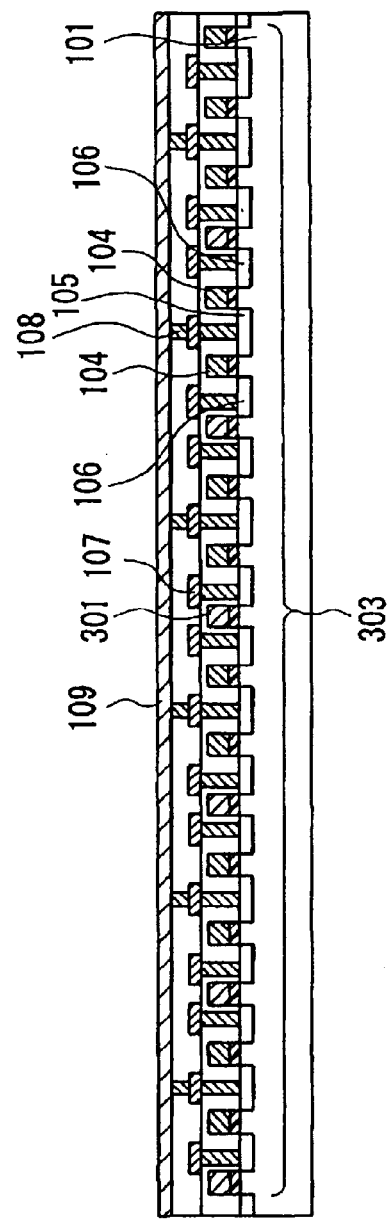
FIG. 3B is a cross-sectional view of a N-type sense amplifier transistor region I taken along a line c–c' in FIG. 3A.

FIG. 3A is a plan view showing a mask layout of a DRAM sense amplifier transistor in a semiconductor device according to Embodiment 3 of the present invention. FIG. 3B is a cross-sectional view of a N-type sense amplifier transistor region I taken along a line c–c' in FIG. 3A. In FIGS. 3A and 3B, the same portions as those in FIGS. 1A and 1B are denoted with the same reference numerals as those therein, and the description thereof will be omitted here.

The present embodiment is different from Embodiment 1 in that the STI regions 102 are removed to form a transistor active region 303 with a larger area, and field shield electrodes 301 are formed between the respective adjacent pairs of gate electrodes 104 in parallel to the gate electrodes 104.

By fixing the field shield electrodes 301 at $V_{ss}$ (0 V) or $V_{bb}$ (substrate voltage in a cell: negative voltage), the respective pairs of transistors are isolated electrically. Therefore, STI isolation is not required in this region.

As described above, according to the present embodiment, the gate electrodes 104 have a linear shape, and the adjacent pairs of sense amplifier transistors and the field shield electrodes 301 are placed in a regular line-and-space shape at a substantially equal interval. Therefore, the DOF can be maximized during lithography. As a result, a variation in a gate processing size can be suppressed, and a variation in characteristics of transistors can be decreased.

Furthermore, since STI isolation is not required, the influence of residual stress during STI formation and the like can be suppressed, the transistor active region 303 with a larger area can be formed, and a variation in characteristics can be prevented from occurring. As a result, a sense amplifier transistor with high sensitivity can be realized.

Thus, by placing the gate electrodes of the sense amplifier transistors and the field shield electrodes in a line-and-space shape at a substantially equal interval, the difference in transistor characteristics is suppressed, and by using field shield isolation, the area of the transistor active region can be enlarged, and the influence of process stress is suppressed. Consequently, a sense amplifier with high performance can be formed.

Embodiment 4

Figure 4A:
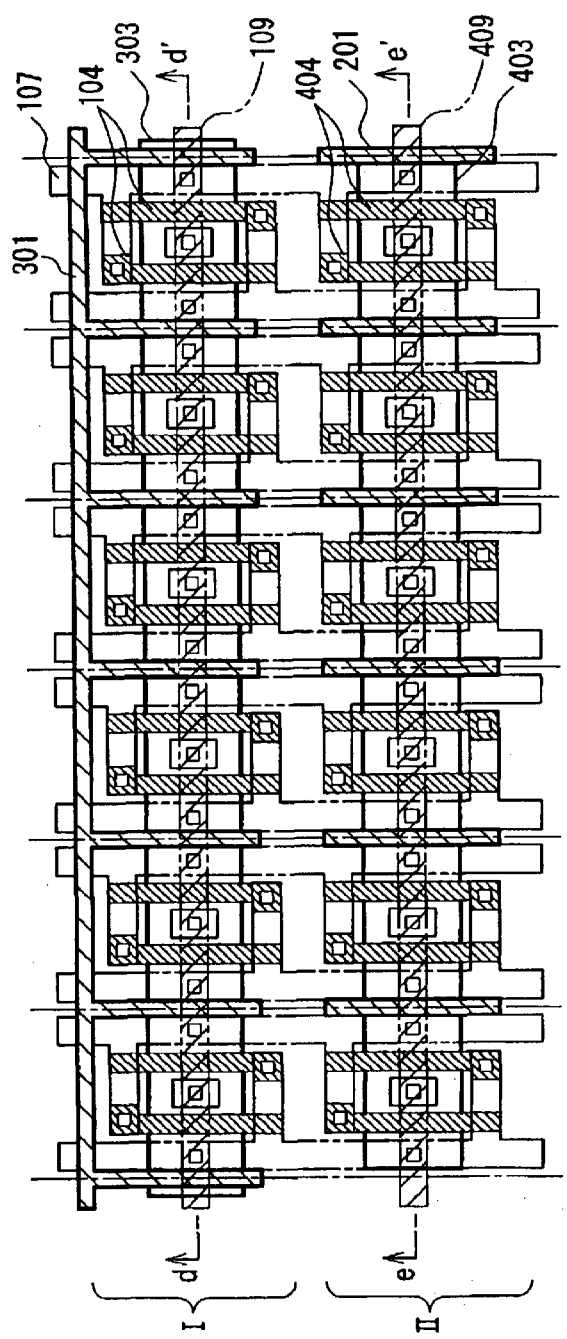
FIG. 4A is a plan view showing a mask layout of a DRAM sense amplifier transistor in a semiconductor device according to Embodiment 4 of the present invention.
Figure 4B:
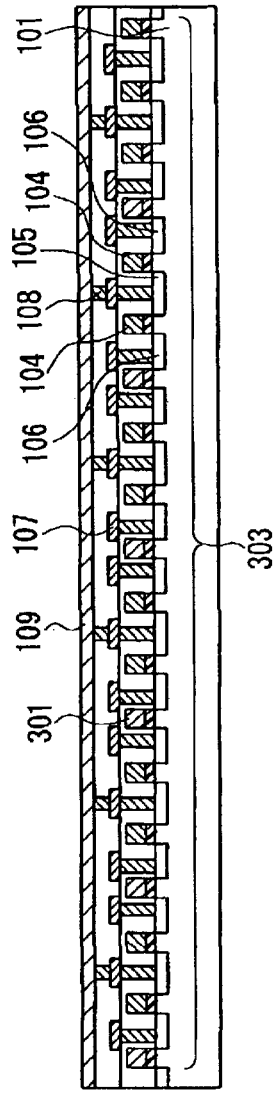
FIG. 4B is a cross-sectional view of a N-type sense amplifier transistor region I taken along a line d–d' in FIG. 4A.

FIG. 4A is a plan view showing a mask layout of a DRAM sense amplifier transistor in a semiconductor device according to Embodiment 4 of the present invention. FIG. 4B is a cross-sectional view of a N-type sense amplifier transistor region I taken along a line d–d' in FIG. 4A, and FIG. 4C is a cross-sectional view of a P-type sense amplifier transistor region II taken along a line e–e' in FIG. 4A In the present embodiment, a N-type sense amplifier transistor region I is formed in accordance with Embodiment 3, and a P-type sense amplifier transistor region II is formed in accordance with Embodiment 2.

As shown in FIG. 4B, in the N-type sense amplifier transistor region I, a pair of linear gate electrodes 104 are formed on a transistor active region 303 on a P-type semiconductor substrate 101 via a gate insulating film in the same direction as that of bit lines 107. A field shield electrode 301 is formed between a pair of adjacent gate electrodes 104 in parallel to the gate electrodes 104. By fixing the field shield electrode 301 at $V_{ss}$ (0 V) or $V_{bb}$ (substrate voltage in a cell: negative voltage), the respective pairs of transistors are electrically isolated. A source region 105 between a pair of gate electrodes 104 is connected to a power source line ($V_{ss}$) made of upper layer metal wiring via a via plug 108. Therefore, STI isolation is not necessary in this region. Drain regions 106 on both sides of the pair of gate electrodes 104 are connected respectively to the bit lines 107 and the opposed gate electrodes 104 in a diagonally crossed manner to form a N-type MOS differential circuit.

Figure 4C:
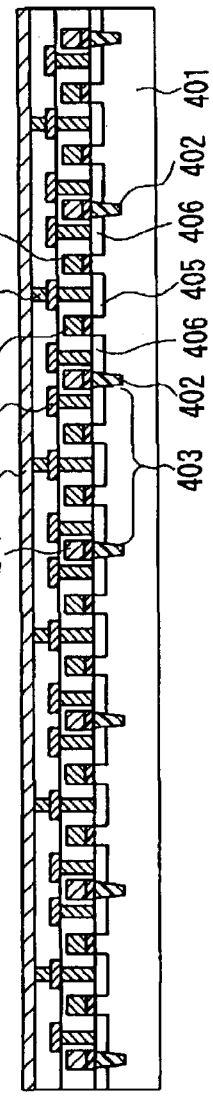
FIG. 4C is a cross-sectional view of a P-type sense amplifier transistor region II taken along a line e–e' in FIG. 4A.
Figure 5:
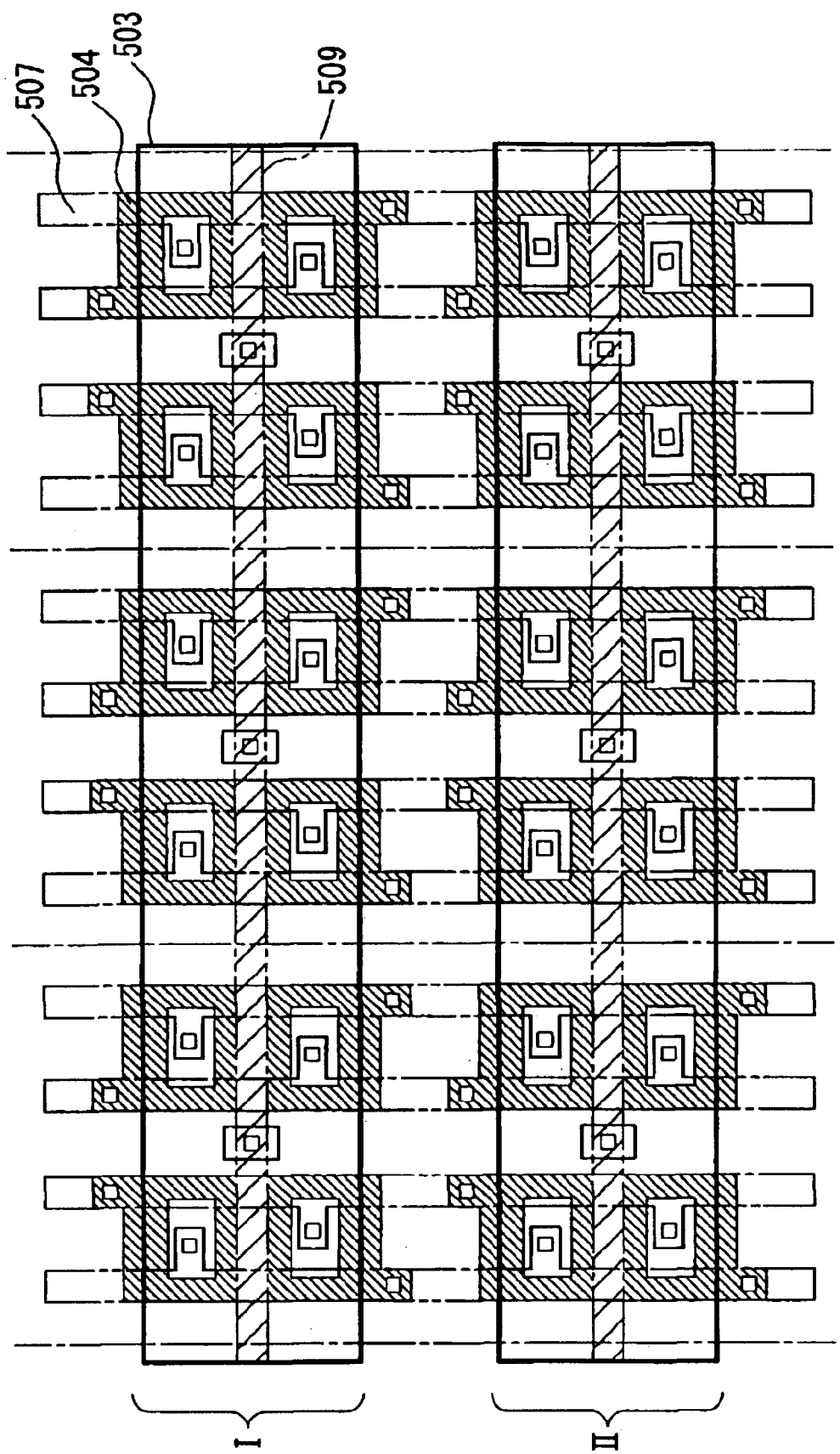
FIG. 5 is a plan view showing a mask layout of a DRAM sense amplifier transistor in a conventional semiconductor device.

On the other hand, as shown in FIG. 4C, in the P-type sense amplifier transistor region II, a transistor active region 403 to be isolated by STI regions 402 is formed on a N-type semiconductor substrate 401 A pair of linear gate electrodes 404 are formed in each active region in the same direction as that of the bit lines 107 via a gate insulating film. A floating electrode 201 is formed on the STI region in parallel to the gate electrodes 404. A source region 405 between the pair of gate electrodes 404 is connected to a power source line ($V_{cc}$) made of upper layer metal wiring via a via plug 408. Drain regions 406 on both sides of the pair of gate electrodes 404 respectively are connected to the bit lines 107 and the opposed gate electrodes 404 in a diagonally crossed manner to form a P-type MOS differential circuit.

As described above, according to the present embodiment, a pair of adjacent N-type sense amplifier transistors and the field shield electrodes 301, and a pair of adjacent P-type sense amplifier transistors and the floating electrodes 201 are placed in a regular line-and-space shape at a substantially equal interval. Therefore, the DOF can be maximized during lithography. As a result, a variation in a gate processing size can be suppressed, and a variation in characteristics of transistors can be decreased.

Furthermore, since STI isolation is not required in the N-type transistor active region 303 likely to be influenced by STI stress, the area of the N-type transistor active region 303 can be enlarged, and a variation in characteristics can be suppressed In the P-type sense amplifier transistor region II, current cut characteristics are lower than those of the N-type sense amplifier transistor region II in field shield isolation. However, there is less influence of stress from STI, so that there is no problem even if a transistor active region is divided. As a result, in the N-type transistor, an influence of residual stress by STI formation process and the like can be suppressed, and a variation in characteristics can be prevented from occurring. Thus, in the P-type transistor, a sense amplifier transistor having high sensitivity and high performance, excellent in device isolation characteristics, can be realized.

Thus, by placing the gate electrodes of the N-type sense amplifier transistors and the field shield electrodes in a line-and-space shape at a substantially equal interval, and by placing the gate electrodes of the P-type sense amplifier transistors and the floating electrodes in a line-and-space shape at a substantially equal interval, the difference in transistor characteristics is suppressed. By using field shield isolation in the N-type sense amplifier transistor region, and by using STI isolation in the P-type sense amplifier transistor region, an influence of process stress is suppressed. Thus, a sense amplifier having high performance, excellent in current cut characteristics, can be formed.

As described above, according to the present invention, a sense amplifier with high sensitivity can be realized in which the difference in characteristics between a pair of sense amplifier transistors of a DRAM is suppressed.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising a DRAM region and a high-speed CMOS logic region that are co-resident with each other,
   wherein a pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines, and a pair of adjacent N-type sense amplifier transistors and a pair of adjacent P-type sense amplifier transistors are isolated by shallow trench isolation (STI) regions.

2. The semiconductor device according to claim 1, wherein floating electrodes are disposed on the shallow trench isolation regions between the pair of adjacent N-type sense amplifier transistors and between the pair of adjacent P-type sense amplifier transistors so as to be parallel to the pair of gate electrodes of each of the sense amplifier transistors.

3. The semiconductor device according to claim 2, wherein the pair of gate electrodes and the floating electrodes are disposed at a substantially equal interval.

4. A semiconductor device comprising a DRAM region and a high-speed CMOS logic region that are co-resident with each other,
   wherein a pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines, active regions are connected to each other in a pair of adjacent N-type sense amplifier transistors and a pair of adjacent P-type sense amplifier transistors, and on the active regions, field shield electrodes are disposed between the pair of adjacent N-type sense amplifier transistors and between the pair of adjacent P-type sense amplifier transistors so as to be parallel to the pair of gate electrodes of each of the sense amplifier transistors.

5. The semiconductor device according to claim 4, wherein the pair of gate electrodes and the field shield electrodes are disposed at a substantially equal interval.

6. The semiconductor device according to claim 4, wherein a ground potential or a negative voltage used for a substrate potential of a DRAM cell is applied to the field shield electrodes on the N-type active regions.

7. A semiconductor device comprising a DRAM region and a high-speed CMOS logic region that are co-resident with each other,
   wherein a pair of gate electrodes of a N-type sense amplifier transistor and a pair of gate electrodes of a P-type sense amplifier transistor constituting a CMOS sense amplifier of the DRAM are disposed respectively in one active region in parallel to each other in the same direction as that of bit lines, active regions are connected to each other in a pair of adjacent N-type sense amplifier transistors, on the active regions, a field shield electrode is disposed between the pair of adjacent N-type sense amplifier transistors so as to be parallel to the pair of gate electrodes of the N-type sense amplifier transistor, a pair of adjacent P-type sense amplifier transistors are isolated by shallow trench isolation (STI) regions, and a floating electrode is disposed on the shallow trench isolation region between the pair of P-type sense amplifier transistors so as to be parallel to the pair of gate electrodes of the P-type sense amplifier transistor.

8. The semiconductor device according to claim 7, wherein the pair of gate electrodes of the N-type sense amplifier transistor and the field shield electrodes, and the pair of gate electrodes of the P-type sense amplifier transistor and the floating electrodes are disposed at a substantially equal interval.

9. The semiconductor device according to claim 7, wherein a ground potential or a negative voltage used for a substrate potential of a DRAM cell is applied to the field shield electrodes on the N-type active regions.

* * * * *